United States Patent [19]

Asami

[11] Patent Number: 5,467,357
[45] Date of Patent: Nov. 14, 1995

[54] EEPROM APPARATUS

[75] Inventor: Kazuo Asami, Itami, Japan

[73] Assignee: Mitsubishi Denki Kabushiki Kaisha, Tokyo, Japan

[21] Appl. No.: 230,456

[22] Filed: Apr. 20, 1994

[30]     Foreign Application Priority Data

Jun. 25, 1993  [JP]  Japan ..................... 5-154950

[51] Int. Cl.$^6$ ................................. G06F 11/10
[52] U.S. Cl. .................. 371/21.3; 371/21.5; 365/201
[58] Field of Search ....................... 371/21.2, 21.3, 371/21.4, 21.8, 27, 70

[56]          References Cited

U.S. PATENT DOCUMENTS 5,172,339  12/1992  Noguchi et al. ................. 371/21.3

OTHER PUBLICATIONS

Nikkei Electronics, Sep. 22, 1986, pp. 133–144.
Nikkei Microdevices, Mar. 1988, pp. 50–55.
*The 8086/8088 Family; Desigh, Programming, and Interfacing* by John Uffenbeck ©1987 by Prentice–Hall Inc. pp. 69–71.

*Primary Examiner*—Vincent P. Canney
*Attorney, Agent, or Firm*—Lowe, Price, LeBlanc & Becker

[57]          ABSTRACT

An EEPROM apparatus being provided with, in an ECC circuit (6), an ECC code generating unit (19) which automatically generates "5(H)" ((H) represents hexadecimal number), that is, "0101(B)" ((B) represents binary number) as the ECC code when data, in which head is 37 1" and thereafter "0" and "1" are repeated in binary notation, for example, "55(H)", that is, "01010101(B)" is written, as the data to be stored in an EEPROM 50, and automatically generates "A(H)", that is, "1010(B)" as the ECC code when data, in which head is "0" and thereafter "1" and "0" are repeated in binary notation, for example, "AA(H)", that is, "10101010(B)" is written, and capable of executing checker pattern test easily and in a short time.

9 Claims, 5 Drawing Sheets

EEPROM APPARATUS

BACKGROUND OF THE INVENTION

1. Field of the Invention

The present invention relates to an EEPROM apparatus which consists of EEPROM and attached equipment and in which a so-called checker pattern test is performed in order to guarantee the reliability of the EEPROM, and more specifically to an EEPROM apparatus built, for example, in a one-chip microcomputer used for an IC card.

2. Description of Related Art

Figure 1:
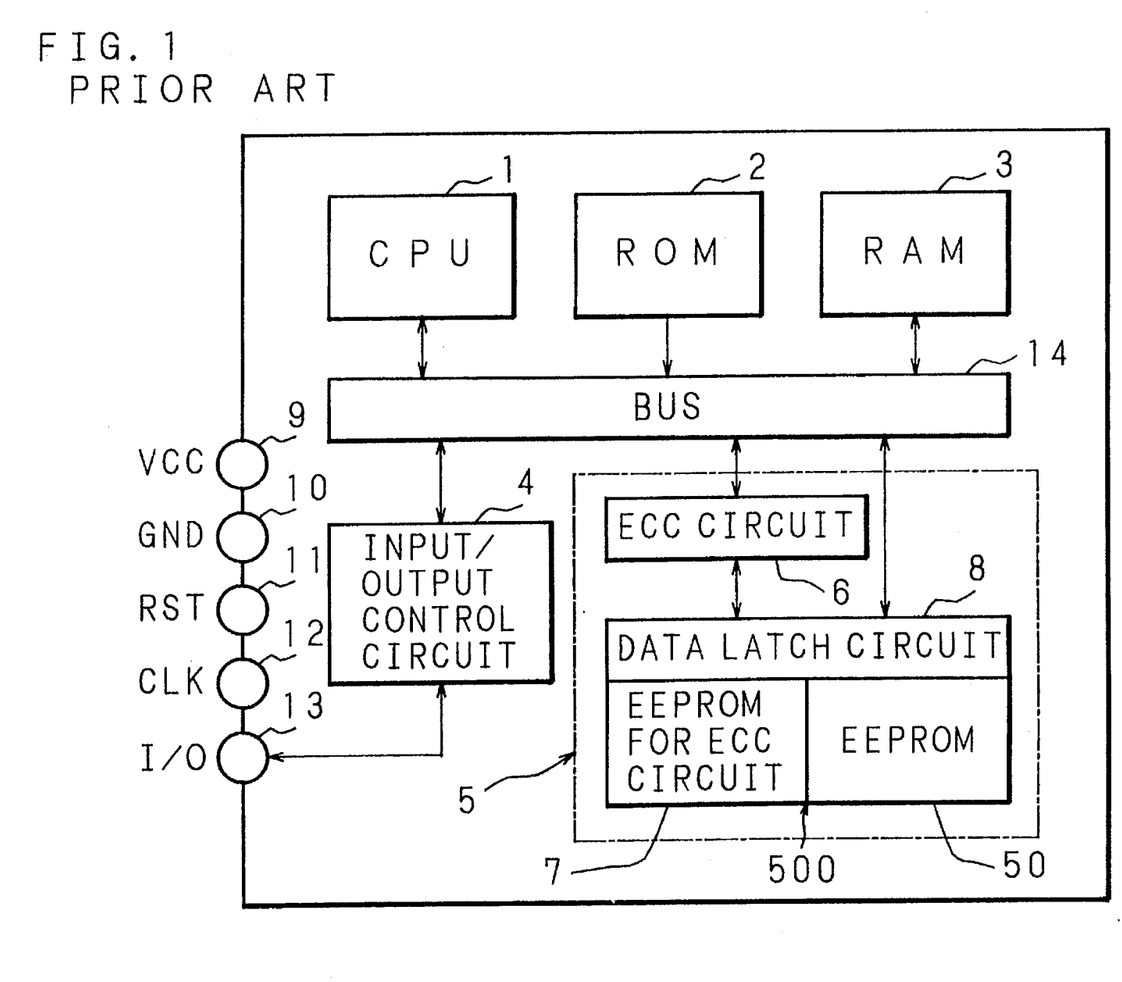

FIG. 1 is a functional block diagram showing a conventional general functional configuration of a one-chip microcomputer in which EEPROM are built in, showing specifically a configuration of a so-called five-terminal type IC card.

In FIG. 1, reference numeral 1 designates a CPU which processes data according to a user program. The user program processed by this CPU 1 is stored in a ROM 2. Among the data processed by the CPU 1, data which is necessary to be temporarily stored is stored in a RAM 3. The CPU 1, the ROM 2 and the RAM 3 are connected to each other by a bus 14.

Reference numeral 4 designates an input/output control circuit which is connected between the bus 14 and an I/O terminal 13 among external connection terminals shown by reference numerals 9 to 13. The input/output control circuit 4 converts serial data inputted from the outside to parallel data to output the parallel data to the bus 14, and converts parallel data given from the bus 14 to serial data to output the serial data via the I/O terminal 13 to the outside.

Reference numeral 5 designates an EEPROM apparatus which is composed of an EEPROM as a programmable data memory designated by numeral 50, an ECC (Error Checking and Correction) circuit 6, an EEPROM 7 for ECC circuit, a data latch circuit 8, and the like.

The EEPROM 50 stores data necessary to be always stored such as data being a processing result by the CPU 1.

The ECC circuit 6 generates an error correction code (ECC code) of data inputted from the bus 14 and stored in the EEPROM 50 and makes the EEPROM 7 for ECC circuit store the ECC code. When data stored in the EEPROM 50 is read out, the ECC circuit 6 outputs the corresponding ECC code from the EEPROM 7 for ECC circuit to the bus 14.

The EEPROM 7 for ECC circuit stores an ECC code generated by the ECC circuit 6 and outputs it to the bus 14 as occasion demands.

And the data latch circuit 8 latches data to be written in the EEPROM 50 and an ECC code generated by the ECC circuit 6.

In addition, in the conventional EEPROM apparatus shown in FIG. 1, memory cells are arranged in the state of matrix in eight-bit width in the EEPROM 50 and one eight-bit data is stored in each row of eight-bit width. While in the EEPROM 7 for ECC circuit, memory cells are arranged in the state of matrix in four-bit width, and one ECC code is stored in each row of four-bit width. But both the EEPROM 50 and the EEPROM 7 are integrated in terms of hardware. When memory cells are assumed to be arranged in the state of matrix in n-bit width in one EEPROM 500. Generally speaking, m bits among n bits and the remaining "n–m" bits in each row of the EEPROM 500 are shared properly by the EEPROM 50 and the EEPROM 7 for ECC circuit.

Accordingly, when data is stored in the EEPROM 50, an ECC code of the data is stored in the row of the EEPROM 7 for ECC circuit being same row of the EEPROM 50 in which the data is stored. In other words, one data of m bits and the ECC code of the data of "n–m" bits are sequentially stored in one row of n bits of the EEPROM 500 constructing the EEPROM 50 and the EEPROM 7 for ECC circuit.

Reference numeral 9 to 13 designates the external connection terminals, as aforementioned, and numeral 9 designates power source (Vcc) terminal to which power source voltage is supplied, numeral 10 designates a ground (GND) terminal to which ground potential is connected, numeral 11 designates a reset (RST) terminal to which reset, signal is inputted, numeral 12 designates a clock (CLK) terminal to which operation clock of this microcomputer is supplied, and numeral 13 designates the I/O terminal to and from which serial data is inputted/outputted, as aforementioned.

When the one-chip microcomputer for IC card shown in FIG. 1 is inserted in a proper apparatus, these external connection terminals 9 to 13 are connected to terminals of the side of the apparatus.

Figure 2:
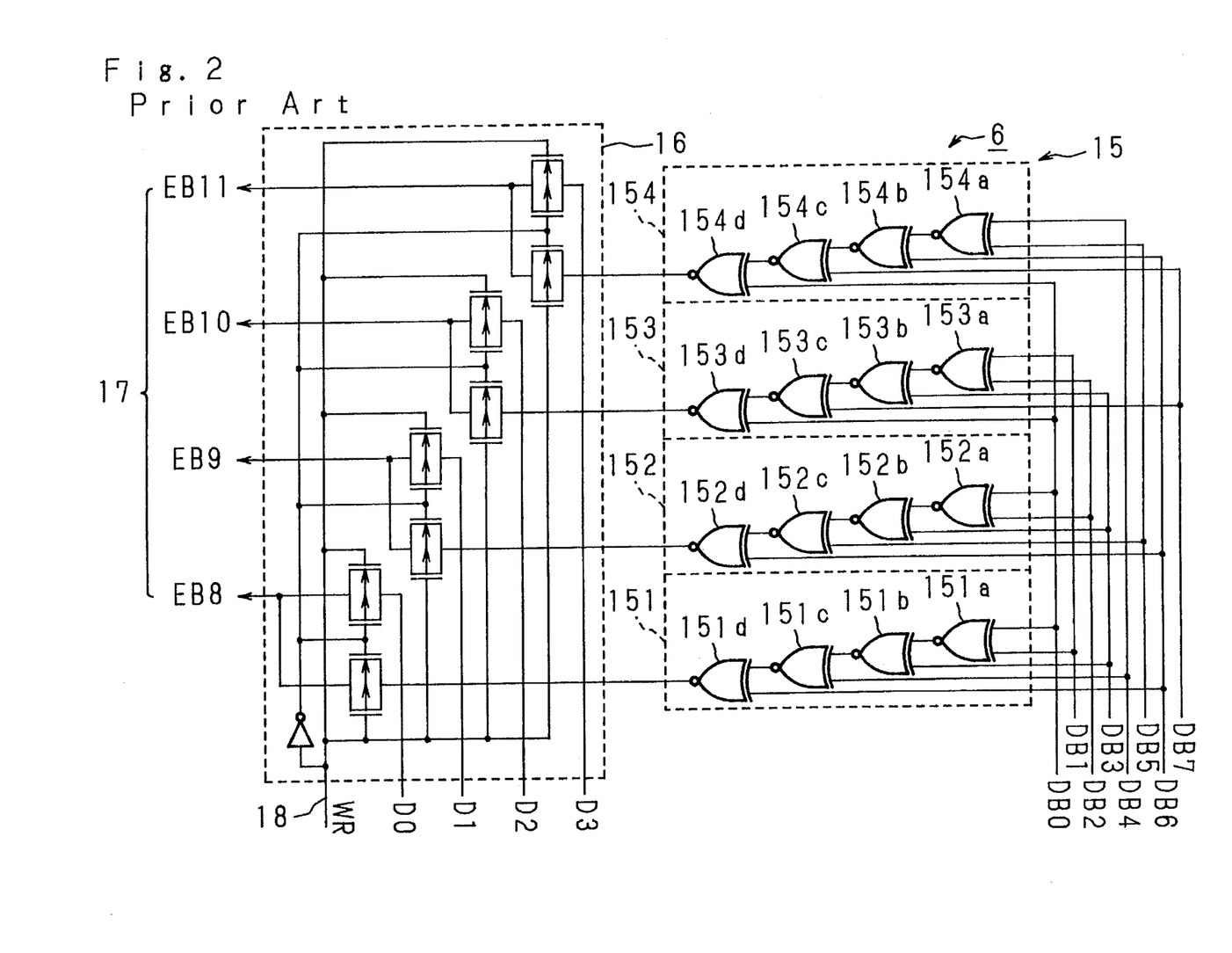

FIG. 2 is a circuit diagram showing a schematic circuit configuration of the aforementioned ECC circuit 6. In FIG. 2, a portion designated by reference numeral 15 is an ECC code generating unit which inputs eight-bit write data DB0 to DB7 to be stored in the EEPROM 50 and generates a four-bit ECC code. In addition, the eight-bit write data DB0 to DB7 is originally the data to be written in the EEPROM 50 from the bus 14 through the data latch circuit 8, however, the same data is also given to the ECC circuit 6 from the bus 14 and an ECC code is generated by the ECC code generating unit 15.

Reference numeral 16 designates a switching circuit which selectively out,puts either an ECC code generated by the ECC code ,generating unit 15 or signals of four bits D0 to D3 given from the CPU 1 outside of the EEPROM apparatus 5 through the bus 14.

The switching circuit 16 is controlled by a control signal WR 18 given from the CPU 1, however, when the control signal WR 18 is in the high level, it outputs the signals of four bits D0 to D3 inputt, ed from the outside, and when the control signal WR 18 is in the low level, it outputs an ECC code generated by the ECC code generating unit 15, selectively. The signals EB8 to EB11 outputted from the switching circuit 16 is given as an EGG code 17 to the EEPROM 7 For ECC circuit through the data latch circuit 8 and stored.

By the way, the ECC code generating unit, 15 consists of four groups of ECC code generating circuits 151 to 154 in order to generate ECC code of four bits. In addition, each of the ECC code generating circuits 151 to 154 is composed of four two-input EXNOR gates.

At the first ECC code generating circuit 151, to an EXNOR gate 151a, the bit DB0 and the bit DB1 are inputted, to an EXNOR gate 151b, the output signal of the EXNOR gate 151a and the bit DB3 are inputted, to an EXNOR gate 151c, the output signal of the EXNOR gate 151b and the bit DB4 are inputted, and to an EXNOR gate 151d, the output signal of the EXNOR gate 151c and the bit DB6 are inputted.

At the second ECC code generating circuit 152, to an EXNOR gate 152a, the bit DB0 and the bit DB2 are inputted, to an EXNOR gate 152b, the output signal of the EXNOR gate 152a and the bit DB3 are inputted, to an EXNOR gate 152c, the output signal of the EXNOR gate 152b and the bit DB5 are inputted, and to an EXNOR gate 152d, the output signal of the EXNOR gate 152c and the bit DB6 are inputted.

At the third ECC code generating circuit 153, to an EXNOR gate 153a, the bit DB1 and the bit DB2 are inputted, to an EXNOR gate 153b, the output of the EXNOR gate 153a and the bit DB3 are inputted, to an EXNOR gate 153c, the output signal of the EXNOR gate 153b and the bit DB7 are inputted, and to an EXNOR gate 153d, the output signal of the EXNOR gate 153c and the bit DB0 are inputted.

At the fourth ECC code generating circuit 154, to an EXNOR gate 154a, the bit DB4 and the bit DB5 are inputted, to an EXNOR gate 154b, the output signal of the EXNOR gate 154a and the bit DB6 are inputted, to an EXNOR gate 154c, the output signal of the EXNOR gate 154b and the bit DB7 are inputted, and to an EXNOR garde 154d, the output signal of the EXNOR gate 154c and the bit DB0 are inputted.

Figure 3:
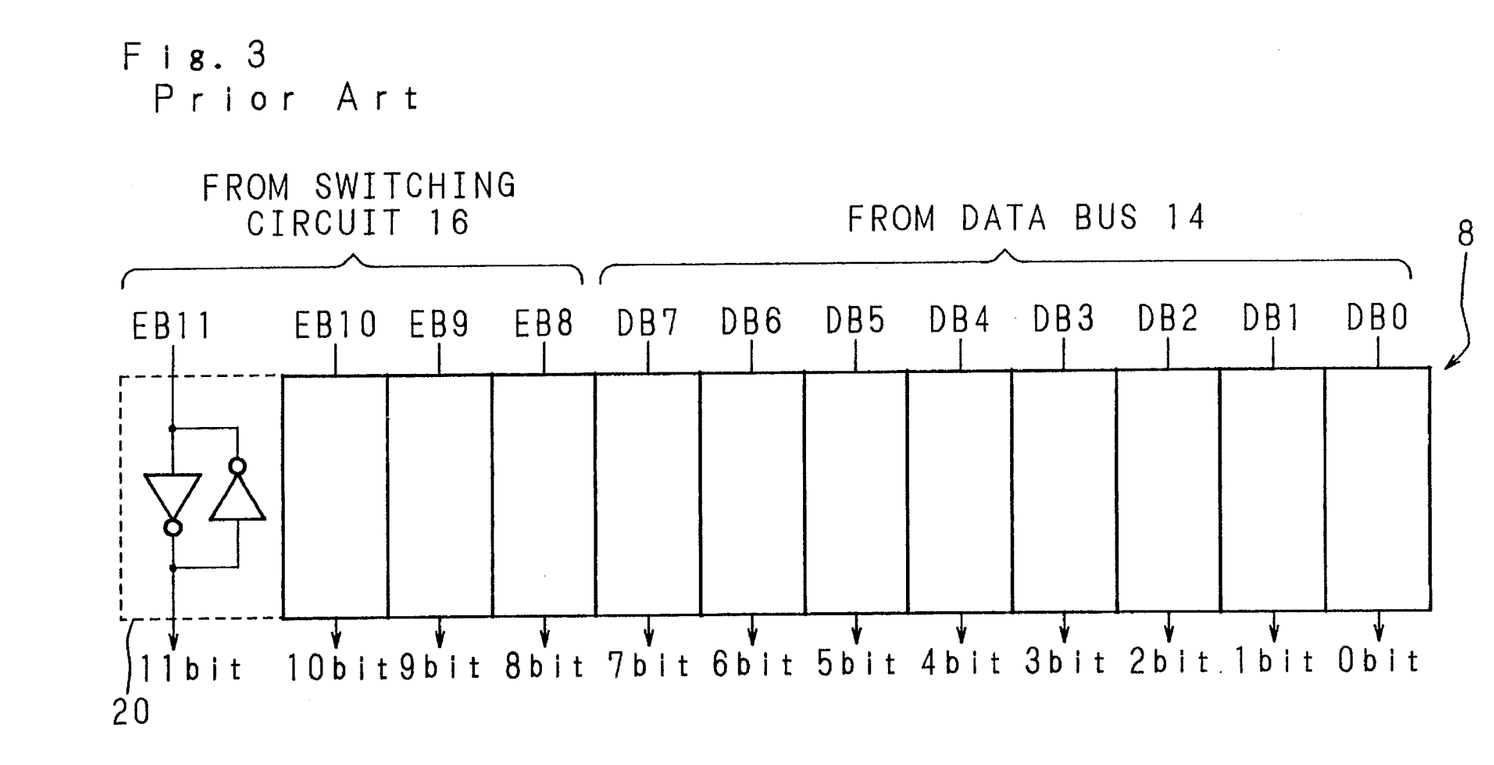
FIG. 3 is a block diagram showing a configuration of a data latch circuit of the same.

FIG. 3 is a block diagram showing a configuration of the data latch circuit 8. The data latch circuit 8 has a 12-bit configuration, and latches the aforementioned EB8 to EB11 of four-bit ECC code and DB0 to DB7 of eight-bit data, and a circuit for each one bit is composed of a general latch circuit in which two inverters are inverse-parallel-connected, as designated by numeral 20.

By the way, in the one-chip microcomputer in which such EEPROM 500 constituted by the EEPROM 50 and EEPROM 7 is built in, it is necessary to perform checker pattern test of the EEPROM 500. The checker pattern test is the one by which whether each memory cell constructing the EEPROM is affected by memory cell adjacent to it or not is checked. Specifically, data ("1" or "0") different from that of four memory cells which are adjacent, in the orthogonal direction of matrix, to each of the memory cells of the EEPROM arranged in the state of matrix is stored, then read it, thereby it is checked whether each of the memory cells is affected by the data stored in memory cell adjacent to each of the memory cells or not.

An actual procedure of this checker pattern test is performed as follows, as an example.

For example, when "55(H)" ((H) represents hexadecimal number) as data, that is, "01010101(B)" ((B) represents binary number) is written in the EEPROM 50, each of the digital values thereof, "0", "1", "0", "1", "0", "1", "0", "1" are stored in a row of eight-bit width of the EEPROM 50 sequentially as DB7, DB6, DB5, DB4, DB3, DB2, DB1, DB0. At the same time, by each of the ECC code generating circuits 151 to 154 of the ECC code generating unit 15, "B(H)", that is, "1011(B)" is generated as an ECC code 17, and the respective digital values thereof, "1", "0", "1", "1" are stored in a row of four-bit width of the EEPROM 7 for ECC circuit sequentially as ECC code EB11, EB10, EB9, EB8.

And when "AA(H)", that is, "10101010(B)", for example, is written as data in the EEPROM 50, the respective digital values thereof, "1", "0", "1", "0", "1", "0", "1", "0" are stored in a row of eight-bit width of the EEPROM 50 sequentially as data DB7, DB6, DB5, DB4 , DB3, DB2, DB1, DB0. At the same time, by each of the ECC code generating circuits 151 to 154 of the ECC code generating unit 15, "6(H)", that is, "0110(B)" is generated as the ECC code 17, and the respective digital values thereof, "0", "1", "1", "0" are stored sequentially in a row of four-bit width of the EEPROM 7 for ECC circuit as ECC code EB11, EB10, EB9, EB8.

Accordingly, when such two kinds of data "55(H)" and "AA(H)" as aforementioned in which "1(B)" and "1(B)" are arranged alternately are written alternately, since their digital values are written intact in the EEPROM bit 50, data stored in a memory cell adjacent to each other of the EEPROM 50 always has a combination of "1(B)" and "0(B)". On the other hand, in the EEPROM 7 for ECC circuit, data of ECC code in which "1(B)" and "0(B)" are not always arranged alternately, not like the aforementioned, is stored. Therefore, by making the control signal WR 18 be in the high level so that data from the outside is inputted to the switching circuit 16, data is written in the EEPROM 7 for ECC circuit separately by the CPU 1.

That is, as D0 to D3, "5(H)", that is, "0101(B)" and "A(H)", that is, "1010(B)" are inputted alternately in the switching circuit 16 so that they are stored in the EEPROM 7 for ECC circuit. Thereby, data stored in a memory cell adjacent to the EEPROM 7 for ECC circuit always has a combination of "1(B)" and "0(B)", and also when the EEPROM 50 and EEPROM 7 are regarded as an integral hardware as the EEPROM 500, data stored in an adjacent memory cell always has a combination of "1(B)" and "0(B)", too.

In addition, when data is written to the aforementioned EEPROM 50 and the EEPROM 7 for ECC circuit, each data is written in the EEPROM 50 or the EEPROM 7 for ECC circuit after being latched temporarily in the data latch circuit 8.

As aforementioned, in an EEPROM of a conventional one-chip microcomputer, data has to be written separately in the EEPROM 50 and the EEPROM 7 for ECC circuit of the EEPROM 500 when checker pattern test is performed, there is such a problem that the checker pattern test is complicated and require a lot of time.

SUMMARY OF THE INVENTION

The present invention has been devised in view of such circumstances, and the object thereof is to provide an EEPROM apparatus capable of performing a checker pattern test for a built-in EEPROM easily and in a short time.

A first invention of the EEPROM apparatus of the invention is characterized by comprising an ECC code generating unit for generating "5(H)" ((H) represents hexadecimal number) that is, "0101(B)" ((B) represents binary number) as an ECC code when data, in which head is "1" and thereafter "0" and "1" are repeated in binary notation, for example, "55(H)", that is, "01010101(B)" is written as data to be stored in the EEPROM for data storing, and generating "A(H)", that is, "1010(B)" as the ECC code when data, in which head is "0" and thereafter "1" and "0" are repeated in binary notation, for example, "AA(H)", that is, "0101010(B)" is written as the data to be stored in the EEPROM for data storing.

A second invention is characterized in that a latch circuit which temporarily latches data to be stored in the EEPROM for data storing and the EEPROM for ECC circuit is composed of latch elements capable of shifting bit one by one .

Moreover, the third invention is characterized in that it has the characteristics of the aforementioned first and second inventions together.

In the first invention, "5(H)", that is, "0101(B)" is generated as the ECC code by the ECC code generating unit when data, in which head is "1", and thereafter "0" and "1" are repeated in binary notation, for example, "55(H)", that is, "01010101(B)" is written as data to be stored in the EEPROM for data storing, and "A(H)", that is, "1010(B)" is generated as the ECC code when data, in which head is "0" and thereafter "1" and "0" are repeated in binary notation, for example, "AA(H)", that is, "10101010(B)" is written.

In the second invention, when data, in which head is "1" and thereafter "0" and "1" are repeated in binary notation, for example, "55(H)", that is, "010101010101(B)" is written, or data, in which head is "0" and thereafter "1" and "0" are repeated, for example, "AAA(H)", that is, "101010101010(B)" is written, at first in the latch circuit only once, data for checker pattern test is stored in the EEPROM for data storing and for the ECC circuit by shifting bit one by one in the following.

Moreover, in the third invention, data, in which head is "1" and thereafter "0" and "1" are repeated in binary notation, for example, "55(H)", that is, "01010101(B)" is written in the EEPROM for data storing at first only once, "5(H)", that is, "0101(B)" is generated as the ECC code and "555(H)", that is, "010101010101(B)" is latched to the latch circuit, and data, in which head is "0" and thereafter "1" and "0" are repeated in binary notation, for example, "AA(H)", that is, "10101010(B)" is written, "A(H)", that is, "1010(B)" is generated as the ECC code, and "AAA(H)", that is, "101010101010(B)" is latched by the latch circuit. And data for checker pattern test is stored in the EEPROM for data storing and the ECC circuit by shifting bit one by one in the following.

The above and further objects and features of the invention will, more fully be apparent from the following detailed description with accompanying drawings.

BRIEF DESCRIPTION OF THE DRAWINGS

FIG. 1 is a block diagram showing a conventional general functional configuration of a one-chip microcomputer in which EEPROM are built in;

FIG. 2 is a circuit diagram showing a schematic circuit configuration of an ECC circuit in a conventional general functional configuration of a one-chip microcomputer in which EEPROM are built in;

DESCRIPTION OF THE PREFERRED EMBODIMENTS

In the following, description will be made on the present invention referring to drawings showing the embodiments thereof.

Figure 4:
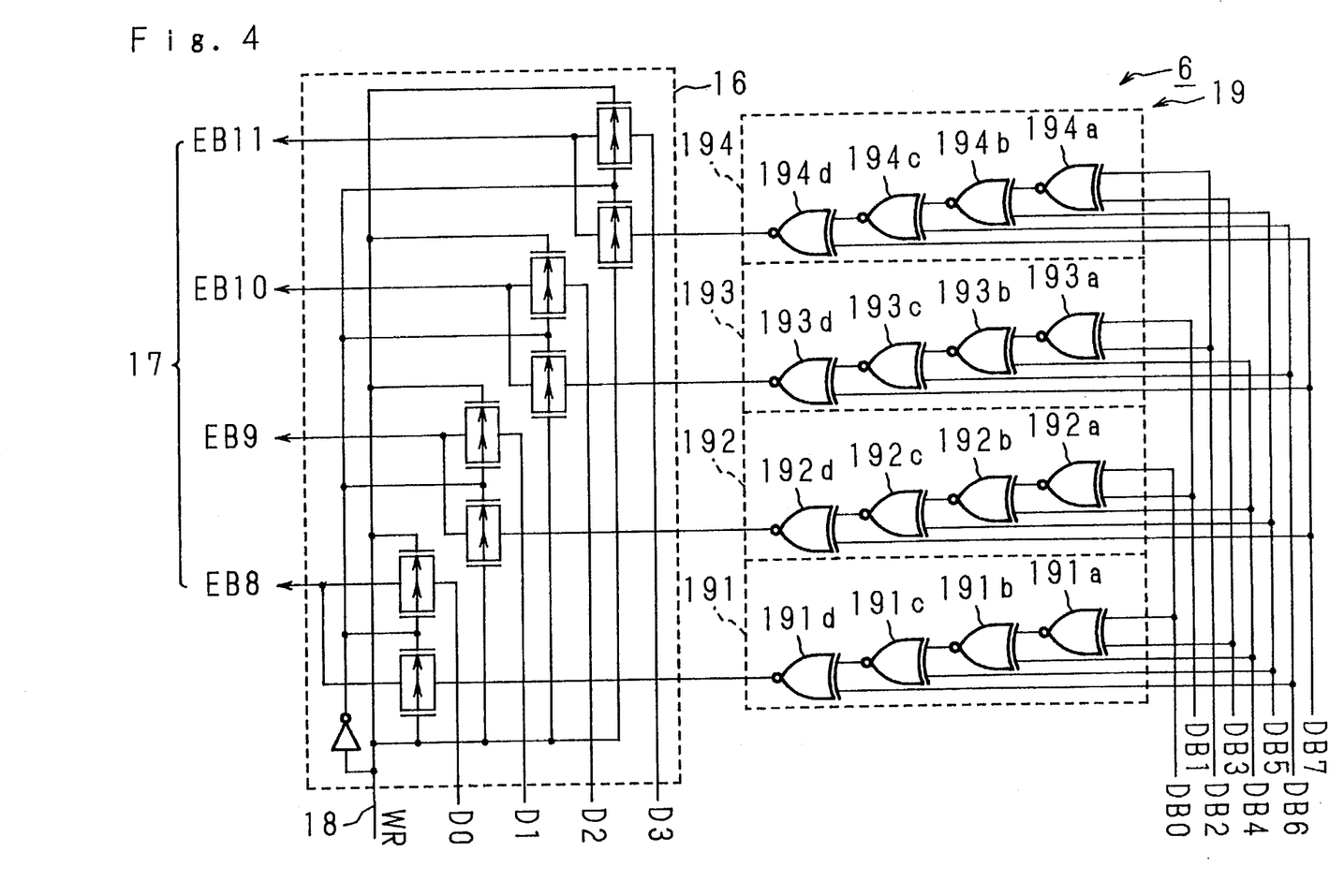
FIG. 4 is a circuit diagram showing a schematic configuration of an ECC circuit of an EEPROM apparatus related to the invention.

FIG. 4 is a circuit diagram showing a schematic configuration of the ECC circuit 6 of the EEPROM related to the invention.

In addition, in FIG. 4, the same reference characters as those shown in FIG. 2 referred to the explanation of the aforementioned conventional example show the same or corresponding portions.

In FIG. 4, the one designated by reference numeral 19 is an ECC code generating unit which inputs eight-bit write data DB0 to DB7 and generates four-bit ECC code. And numeral 16 designates a switching circuit which selectively outputs either the ECC code generated by the ECC code generating unit 19 or four-bit signals D0 to D3 given from, for example, CPU or the like at the outside.

The switching circuit 16 is controlled by a control signal designated by numeral 18, and signals EB8 to EB11 outputted from the switching circuit 16 are stored in the EEPROM 7 for ECC circuit as the ECC code 17.

By the way, the ECC code generating unit 19 is composed of four sets of ECC code generating circuits 191 to 194 in order to generate four-bit ECC code. In addition, each of the ECC code generating circuits 191 to 194 is composed of Four two-input EXNOR gates At the first ECC code generating circuit 191, to an EXNOR gate 191a, the bit DB0 and the bit DB3 are inputted, to an EXNOR gate 191b, the output signal of the EXNOR gate 191a and the bit DB4 are inputted, to an EXNOR gate 191c, the output signal of the EXNOR gate 191b and the bit DB5 are inputted, and to an EXNOR gate 191d, the output signal of the EXNOR gate 191c and the bit DB6 are inputted.

At the second ECC code generating circuit 192, to an EXNOR gate 192a, the bit DB0 and the bit DB1 are inputted, to an EXNOR gate 192b, the output signal of the EXNOR gate 192a and the bit DB4 are inputted, to an EXNOR gate 192c, the output signal of the EXNOR gate 192b and the bit DB5 are inputted, and to an EXNOR gate 192d, the output signal of the EXNOR gate 192c and the bit DB7 are inputted.

At the third ECC code generating circuit 193, to an EXNOR gate 193a, the bit DB1 and the bit DB2 are inputted, to an EXNOR gate 193b, the output signal of the EXNOR gate 193a and the bit DB4 are inputted, to an EXNOR gate 193c, the output signal of the EXNOR gate 193b and the bit DB6 are inputted, and to the EXNOR gate 193d, the output signal of the EXNOR gate 193c and the bit DB7 are inputted.

At the Fourth ECC code generating circuit 194, to an EXNOR gate 194a, the bit DB2 and the bit DB3 are inputted, to an EXNOR gate 194b, the output signal of the EXNOR gate 194a and the bit DB5 are inputted, to an EXNOR gate 194c, the output signal of the EXNOR gate 194b and the bit DB6 are inputted, and to an EXNOR pale 194d, the output signal of the EXNOR gate 194c and the bit DB7 are inputted.

In the one-chip microcomputer of the invention in which such EEPROM 50 having the ECC code generating unit 19 is built in, the checker pattern test of the EEPROM 500 constituted by the EEPROM 50 and the EEPROM 7 for ECC circuit is performed as follows.

For example, when "55(H)" ((H) represents hexadecimal number) , that is, "01010101(B)" ((B) represents binary number) is written as data in the EEPROM 50, each of the digital values thereof, "0", "1", "0", "1", "0", "1", "0", "1" are stored sequentially in a row of eight-bit width of the EEPROM 50 as data DB7 , DB6 , DB5 , DB4, DB3 , DB2 , DB1 , DB0. At the same time, by each of the ECC generating circuits 191 to 194 of the ECC code generating unit "5(H)", that is, "0101(B)" is generated as ECC code 17, and each of the digital values thereof, "0", "1", "0", "1" are stored sequentially in a row of four-bit width of the EEPROM 7 for ECC circuit as ECC code EB11, EB10, EB9, EB8.

And, for example, when "AA(H)", that is, "10101010(B)" is written as data in the EEPROM 50, each of the digital values thereof "1", "0", "1", "0", "1", "0""1", "0" are stored sequentially in a row of eight-bit width of the EEPROM 50 as data DB7 , DB6 , DB5 , DB4 , DB3 , DB2 , DB1 , DB0.

At the same time, by each of the ECC code generating circuits 191 to 194 of the ECC code generating unit 19, "A(H)", that is, "1010(B)" is generated as ECC code 17, and each of the digital values thereof, "1", "0", "1", "0" are stored sequentially in a row of four-bit width of the EEPROM 7 for ECC circuit as ECC code EB11, EB10, EB9, EB8.

Accordingly, when such two kinds of data "55(H)" and "AA(H)" as aforementioned, in which "1(B)" and "0(B)" are alternately arranged, are written alternately, since the digital values there f are written intact in the EEPROM 50, data stored in a memory cell adjacent to the EEPROM 50 always has a combination of "1(B)" and "0(B)". On the other hand, data, in which "1(B)" and "0(B)" generated in each of the ECC code generating circuits 191 to 194 of the ECC code generating unit 19 are alternately arranged, is stored also in the EEPROM 7 for ECC circuit. And also when the EEPROM 50 and the EEPROM 7 for ECC circuit, are regarded as an integral hardware as the EEPROM 500, data stored in an adjacent memory cell always has a combination of "1(B)" and "0(B)".

Thereby, data stored in a memory cell adjacent to the EEPROM 7 for ECC circuit always has a combination of "1(B)" and "0(B)" without performing operations such as making the control signal WR 18 be in the high level, switching the switching circuit 16 and inputting D0 to D3 from the CPU or the like at the outside as ECC code 17, which were conventionally necessary.

In addition, in such an EEPROM apparatus of the invention as aforementioned, the switching circuit 16 is unnecessary at the checker pattern test, however, the switching circuit 16 is necessary for setting the ECC code 17 by the CPU for other various tests. In other words, in the EEPROM apparatus of the invention, when checker pattern test is performed, by only the fact that the two kinds of data "55(H)" and "AA(H)" are alternately written as data in the EEPROM 50, data necessary also for the EEPROM 7 for ECC circuit is written automatically.

But, in the case where a test other than checker pattern test is never performed in the EEPROM apparatus, it is a matter of course that the switching circuit 16 is unnecessary.

Figure 5:
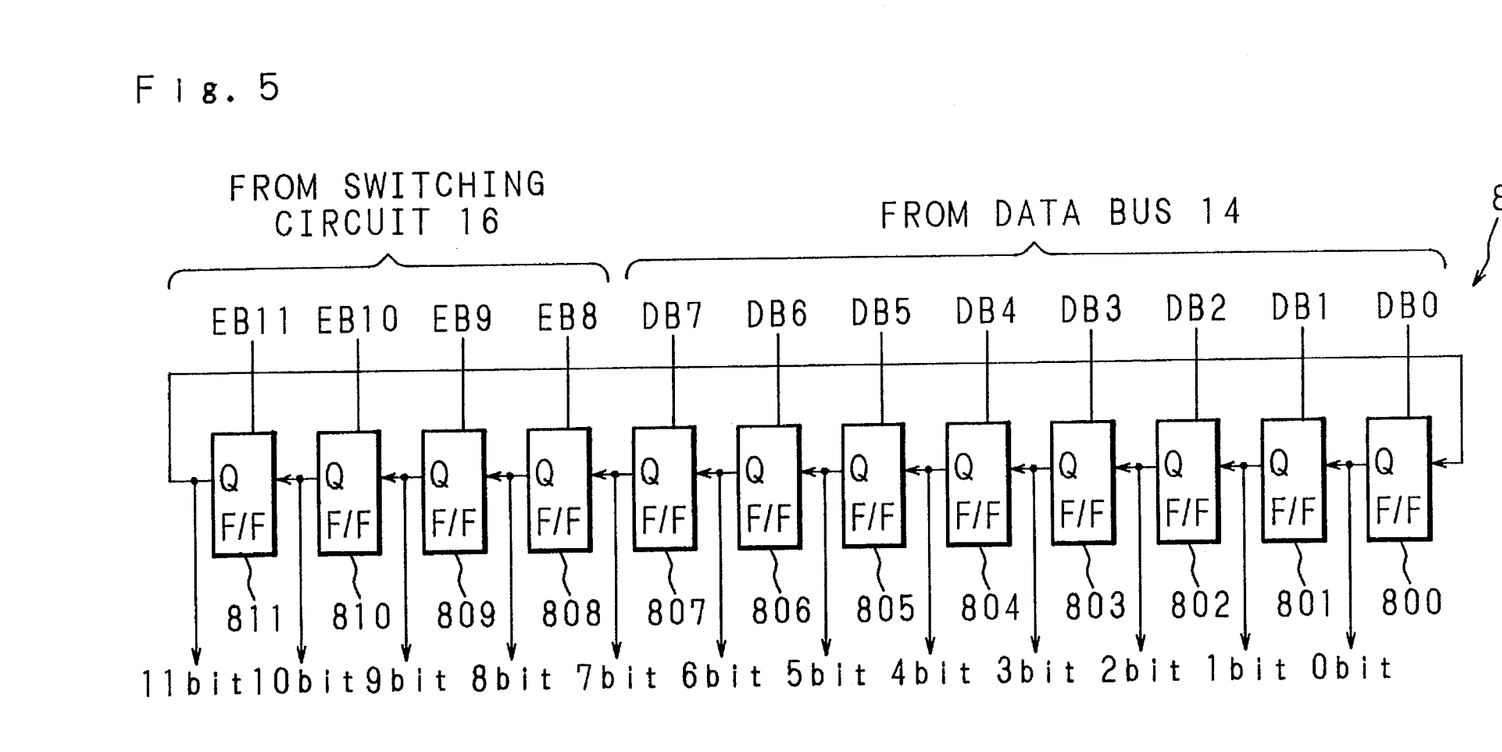
FIG. 5 is a block diagram showing a configuration of a data latch circuit for showing one embodiment of the second invention of the invention.

FIG. 5 is a block diagram showing a configuration of the data latch circuit 8 for showing one embodiment of the second invention of the present invention.

In the conventional example, a circuit for one bit of the data latch circuit 8 is, as shown in FIG. 3, composed of a latch in which two inverters are inverse-parallel-connected, however, it is composed of flip-flop as latch element in the second invention.

That is, in the second invention of the EEPROM apparatus of the present invention, the eight-bit data DB0 to DB7 inputted to the EEPROM 50 and four-bit ECC code EB8 to EB11 inputted to the EEPROM 7 for ECC circuit, that is, 12 bits are temporarily set Lo flip flops 800 to 811 of the data latch circuit 8 and latched respectively. The output signals of the respective flip flops 800 to 810 are shifted and latched to the respective flip flops 801 to 811, and the output signal of the flip flop 811 is Lo the flip flop 800 respectively. In other words, the flip flop 800 to 811 is configured as a circular type shift circuit as a whole.

In addition, in the second invention of the EEPROM apparatus of the invention, configurations other than the data latch circuit 8 is same as those of the conventional example shown in FIG. 1.

In the EEPROM apparatus of the second invention provided with the data latch circuit 8 configured as aforementioned, after the control signal WR 18 is made to be in the high level so that the switching circuit 16 of the ECC circuit 6 is controlled to select the exterior input data DO to D3, the data latch circuit 8 is made to latch data so that "55(H)", that is, "01010101(B)" is written in the EEPROM 50 and "5(H)", that is, "0101(B)" is written in the EEPROM 7 for ECC circuit as exterior input data. Here, when 12-bit data latched in the data latch circuit 8 is written in a first, address of the EEPROM 50 and the EEPROM 7 for ECC circuit, "555(H)", that is, "010101010101(B)" is stored in the EEPROM 50 and the EEPROM 7 for ECC circuit.

Next, when data latched in each of the flip flops 800 to 811 constructing the data latch circuit 8 is shifted for one bit from the lower bit side to the upper bit side, for example, by a control signal (not shown) of the control from the CPU and the like as shown by an arrow in FIG. 5, the data latch circuit 8 is in the state where 12-bit data "1010101010(B)", that is, "AAA(H)" is latched. When "AAA(H)" latched in the data latch circuit 8 is written in the second address of the EEPROM 50 and the EEPROM 7 for ECC circuit, data "AAA(H)", that is, "101010101010(B)" is stored in the EEPROM 50 and the EEPROM 7 for ECC circuit.

In addition, since the flip flops 800 to 811 constructing the data latch circuit 8 are configured as a circulating type shift circuit, it is also proper that data latched by them are shifted for bit from the upper bit side to the lower bit side, not from, for example, the lower bit side to the upper bit side as shown by an arrow in FIG. 5.

In the following, by repeating an operation for shifting 12-bit data latched in flip flop 800 to 811 of the data latch circuit 8 by one bit after inhibiting of data inputting to the data latch circuit 8, and an operation of writing the resultant data in the next address of the EEPROM 50 and the EEPROM 7 for ECC circuit, data stored in a memory cell adjacent to the EEPROM 50 and the EEPROM 7 for ECC circuit always has a combination of "1(B)" and "0(B)" only by inputting data only once at first Next, explanation will be made on the third invention of the EEPROM apparatus of the invention. The third invention has the ECC circuit 6 of the aforementioned first invention and the data latch circuit 8 of the aforementioned second invention.

In such a third invention, when checker pattern test is performed, "55(H)", that is, "01010101(B)", for example, is written in the EEPROM 50, since "5(H)", that is, "0101(B)" is automatically generated by the ECC circuit 6, "555(H)", that is, "010101010101(B)" is latched to the data latch circuit 8 without performing such an operation which was required conventionally that the control signal WR 18 is made to be in the high level so that the switching circuit 16 is switched to input D0 to D3 from the CPU and the like at the outside as ECC code 17. Operations in the following are same as those in the aforementioned second invention.

In addition, explanation was made on the assumption that data to be stored in the EEPROM 50 is eight bits and ECC code to be stored in the EEPROM 7 is four bits for convenience in the embodiments of the respective inventions, however, these bit numbers are only examples, and it is a matter of course that an optional bit number is adaptable to the present invention.

As is described above, according to the first invention of the EEPROM apparatus of the present invention, by storing "55(H)", that is, "01010101(B)" in a row of the EEPROM for data storing, "5(H)", that is, "0101(B)" is stored automatically also in the same row of the EEPROM for ECC circuit, and by storing "AA(H)", that is, "10101010(B)" in a row of the EEPROM for data storing, "A(H)", that is, "1010(B)" is stored automatically also in the same row of the EEPROM for ECC circuit. Accordingly, it becomes unnecessary that data for testing is stored separately in the EEPROM for ECC circuit, thereby checker pattern test becomes easy and the testing time becomes short.

And, according to the second invention, by storing "55(H)", that is, "01010101(B)" or "AA(H)", that is, "10101010(B)" in the EEPROM for data storing and "5(H)", that is, "0101(B)" or "A(H)", that is, "1010(B)" in the EEPROM for ECC circuit at first only once, since "555(H)", that is, "010101010101(B)" or "AAA(H)", that is, "101010101010(B)" is latched by the data latch circuit, it becomes possible to store data for testing by shifting data of each bit of the data latch circuit bit by bit in the following.

Further, according to the third invention, by storing "55(H)", that is, "01010101(B)" or "AA(H)", that is, "10101010(B)" in the EEPROM for data at first only once, since "555(H)", that is, "010101010101(B)" or "AAA(H)", that is, "101010101010(B)" is latched by the data latch circuit, it becomes possible to store data for testing by shifting data of each bit of the data latch circuit bit by bit in the following.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. An EEPROM apparatus comprising: an EEPROM including memory cells arranged in a matrix of rows and columns with each row (or column) being of n-bit width (n is a natural number), and an error correction code generating unit for generating an error correction code of "n–m" bits when data of m bits (m is a natural number, m<n) to be stored is supplied, wherein when said data of m bits to be stored is supplied, said EEPROM stores said data in m bits of the higher side (or lower side) of a row (or column) of n-bit width, and stores the error correction code generated by said error correction code generating unit from said data in the remaining bits of the same row (or the same column) of n-bit width of said EEPROM, and said error correction code generating unit generates, when said data of m bits to be stored in said EEPROM is composed of binary notations "1" and "0" alternately repeated, the error correction code whose value of the most significant bit (or the least significant bit) is different from a value of the least significant bit (or the most significant bit) of the adjacent data, and which is composed of "1" and "0" alternately repeated.

2. An EEPROM apparatus as set forth in claim 1, wherein said EEPROM stores data of eight (=m) bits, and said error correction code generating unit generates an error correction code of four (=n–m, n=12 here) bits.

3. An EEPROM apparatus as set forth in claim 2, wherein said error correction code generating unit comprises:

a first ECC code generating circuit having a first EXNOR gate to which a first bit and a fourth bit among eight bits of data are inputted, a second EXNOR gate to which the output signal of said first EXNOR gate and a fifth bit among eight bits of the data are inputted, a third EXNOR gate to which the output signal of said second EXNOR gate and a sixth bit among eight bits of the data are inputted, and a fourth EXNOR gate to which the output signal of said third EXNOR gate and a seventh bit among eight bits of the data are inputted, and outputting the output signal of said fourth EXNOR gate as a first bit of an error correction code of four bits;

a second ECC code generating circuit having a fifth EXNOR gate to which a first bit and a second bit among eight bits of the data are inputted, a sixth EXNOR gate to which the output signal of said fifth EXNOR gate and a fifth bit among eight bits of the data are inputted, a seventh EXNOR gate to which the output signal of said sixth EXNOR gate and a sixth bit among eight bits of the data are inputted, and an eighth EXNOR gate to which the output signal of said seventh EXNOR gate and an eighth bit among eight bits of the data are inputted, and outputting the output signal of said EXNOR gate as a second bit of the error correction code of four bits;

a third ECC code generating circuit having a ninth EXNOR gate to which a second bit and a third bit among eight bits of the data are inputted, a 10th EXNOR gate to which the output signal of said ninth EXNOR gate and a fifth bit among eight bits of the data are inputted, an 11th EXNOR gate to which the output signal of said 10th EXNOR gate and a seventh bit among eight bits of the data are inputted, and a 12th EXNOR gate to which the output signal of said 11th EXNOR gate and an eighth bit among eight bits of the data are inputted, and outputting the output signal of said 12th EXNOR gate as a third bit of the error correction code of four bits; and a fourth ECC code generating circuit having a 13th EXNOR gate to which a third bit and a fourth bit among eight bits of the data are inputted, a 14th EXNOR gate to which the output signal of said 13th EXNOR gate and a sixth bit among eight bits of the data are inputted, a 15th EXNOR gate to which the output signal of said 14th EXNOR gate and a seventh bit among eight bits of the data, and a 16th EXNOR gate to which the output signal of said 15th EXNOR gate and an eighth bit among eight bits of the data are inputted, and outputting the output signal of said 16th EXNOR gate as a fourth bit of the error correction code of four bits.

4. An EEPROM apparatus comprising: an EEPROM including memory cells arranged in a matrix of rows and columns with each row (or column) being of n-bit width (n is a natural number), an error correction code generating unit for generating an error correction code of "n–m" bits when data of m bits (m is a natural number, m<n) to be stored is supplied, and a data latch circuit for latching said data of m bits and error correction code of "n–m" bits to be stored in said EEPROM, wherein when said data of m bits to be stored is supplied, said EEPROM stores said data in m bits of the higher side (or lower side) of a row (or column) of n-bit width, and stores the error correction code generated by said error correction code generating unit from said data in the remaining bits of the same row (or the same column) of n-bit width of said EEPROM, and said latch circuit comprises latch elements capable of shifting data bit by bit.

5. An EEPROM apparatus as set forth in claim 4, wherein said EEPROM stores data of eight (=m) bits, and said error correction code generating unit generates an error correction code of four (=n−m, n=12 here) bits.

6. An EEPROM apparatus as set forth in claim 4, wherein said error correction code generating unit comprises:

a first ECC code generating circuit having a first EXNOR gate to which a first bit and a fourth bit among eight bits of data are inputted, a second EXNOR gate to which the output signal of said first EXNOR gate and a fifth bit among eight bits of the data are inputted, a third EXNOR gate to which the output signal of said second EXNOR gate and a sixth bit among eight bits of the data are inputted, and a fourth EXNOR gate to which the output signal of said third EXNOR gate and a seventh bit among eight bits of the data are inputted, and outputting the output signal of said fourth EXNOR gate as a first bit of an error correction code of four bits;

a second ECC code generating circuit having a fifth EXNOR gate to which a first bit and a second bit among eight bits of the data are inputted, a sixth EXNOR gate to which the output signal of said fifth EXNOR gate and a fifth bit among eight bits of the data are inputted, a seventh EXNOR gate to which the output signal of said sixth EXNOR gate and a sixth bit among eight bits of the data are inputted, and an eighth EXNOR gate to which the output signal of said seventh EXNOR gate and an eighth bit among eight bits of the data are inputted, and outputting the output signal of said EXNOR gate as a second bit of the error correction code of four bits;

a third ECC code generating circuit having a ninth EXNOR gate to which a second bit and a third bit among eight bits of the data are inputted, a 10th EXNOR gate to which the output signal of said ninth EXNOR gate and a fifth bit among eight bits of the data are inputted, an 11th EXNOR gate to which the output signal of said 10th EXNOR gate and a seventh bit among eight bits of the data are inputted, and a 12th EXNOR gate to which the output signal of said 11th EXNOR gate and an eighth bit among eight bits of the data are inputted, and outputting the output signal of said 12th EXNOR gate as a third bit of the error correction code of four bits; and a fourth ECC code generating circuit having a 13th EXNOR gate to which a third bit and a fourth bit among eight bits of the data are inputted, a 14th EXNOR gate to which the output signal of said 13th EXNOR gate and a sixth bit among eight bits of the data are inputted, a 15th EXNOR gate to which the output signal of said 14th EXNOR gate and a seventh bit among eight bits of the data, and a 16th EXNOR gate to which the output signal of said 15th EXNOR gate and an eighth bit among eight bits of the data are inputted, and outputting the output signal of said 16th EXNOR gate as a fourth bit of the error correction code of four bits.

7. An EEPROM apparatus comprising: an EEPROM including memory cells arranged in a matrix of rows and columns with each row or column being of n-bit width (n is a natural number), an error correction code generating unit for generating an error correction code of "n−m" bits when data of m bits (m is a natural number, m<n) to be stored is supplied, and a data latch circuit for latching said latch of m bits and error correction code of "n−m" bits to be stored in said EEPROM, wherein when said data of m bits to be stored is supplied, said EEPROM stores said data in m bits of the higher side (or lower side) of a row (or column) of n-bit width, and stores the error correction code generated by said error correction code generating unit from said data in the remaining bits of the same row (or the same column) of n-bit width of said EEPROM, said error correction code generating unit generates, when said data of m bits to be stored in said EEPROM is composed of binary notations "1" and "0" alternately repeated, the error correction code whose value of the most significant bit (or the least significant bit) is different from a value of the least significant bit (or the most significant bit) of the adjacent data, and which is composed of "1" and "0" alternately repeated, and said latch circuit comprises latch elements capable of shifting data bit by bit.

8. An EEPROM apparatus as set forth in claim 7, wherein said EEPROM stores data of eight (=m) bits, and said error correction code generating unit generates an error correction code of four (=n−m, n=12 here) bits.

9. An EEPROM apparatus as set forth in claim 7, wherein said error correction code generating unit comprises:

a first ECC code generating circuit having a first EXNOR gate to which a first bit and a fourth bit among eight bits of data are inputted, a second EXNOR gate to which the output signal of said first EXNOR gate and a fifth bit among eight bits of the data are inputted, a third EXNOR gate to which the output signal of said second EXNOR gate and a sixth bit among eight bits of the data are inputted, and a fourth EXNOR gate to which the output signal of said third EXNOR gate and a seventh bit among eight bits of the data are inputted, and outputting the output signal of said fourth EXNOR gate as a first bit of an error correction code of four bits;

a second ECC generating circuit having a fifth EXNOR gate to which a first bit and a second bit among eight bits of the data are inputted, a sixth EXNOR gate to which the output signal of said fifth EXNOR gate and a fifth bit among eight bits of the data are inputted, a seventh EXNOR gate to which the output signal of said sixth EXNOR gate and a sixth bit among eight bits of the data are inputted, and an eighth EXNOR gate to which the output signal of said seventh EXNOR gate and an eighth bit among eight bits of the data are inputted, and outputting the output signal of said EXNOR gate as a second bit or the error correction code of four bits;

a third ECC code generating circuit having a ninth EXNOR gate to which a second bit and a third bit among eight bits of the data are inputted, a 10th EXNOR gate to which the output signal of said ninth EXNOR gate and a fifth bit among eight bits of the data are inputted, an 11th EXNOR gate to which the output signal of said 10th EXNOR gate and a seventh bit among eight bits of the data are inputted, and a 12th EXNOR gate to which the output signal of said 11th EXNOR gate and an eighth bit among eight bits of the data are inputted, and outputting the output signal of said 12th EXNOR gate as a third bit of the error correction code of four bits; and a fourth ECC code generating circuit having a 13th EXNOR gate to which a third bit and a fourth bit among eight bits of the data are inputted, a 14th EXNOR gate to which the output signal of said 13th EXNOR gate and a sixth bit among eight bits of the data are inputted, a 15th EXNOR gate to which the output signal of said 14th EXNOR gate and a seventh bit among eight bits of the data, and a 16th EXNOR gate to which the output signal of said 15th EXNOR gate and an eighth bit among eight bits of the data are inputted, and outputting the output signal of said 16th EXNOR gate as a fourth bit of the error correction code of four bits.

* * * * *